(12) United States Patent  (10) Patent No.: US 7,933,130 B2
Shih  (45) Date of Patent: Apr. 26, 2011

(54) EMBEDDED SEAT SLOT STRUCTURE

(75) Inventor: Zhih-Pei Shih, Taipei (TW)

(73) Assignee: Asustek Computer Inc., Taipei (TW)

( * ) Notice: Subject to any disclaimer, the term of this patent is extended or adjusted under 35 U.S.C. 154(b) by 0 days.

(21) Appl. No.: 12/625,733

(22) Filed: Nov. 25, 2009

(65) Prior Publication Data
US 2010/0167566 A1  Jul. 1, 2010

(30) Foreign Application Priority Data

Dec. 29, 2008 (TW) .............................. 97151240 A

(51) Int. Cl.
*H05K 7/02* (2006.01)
*H05K 7/04* (2006.01)
(52) U.S. Cl. ....................... 361/810; 361/807
(58) Field of Classification Search .................. 361/730, 361/752, 790, 797, 800, 807, 810; 439/131, 439/159, 160, 341
See application file for complete search history.

(56) References Cited

U.S. PATENT DOCUMENTS

| | | | | |
|---|---|---|---|---|
| 5,122,069 A | * | 6/1992 | Brownlie et al. | 439/131 |
| 5,738,537 A | * | 4/1998 | Setoguchi et al. | 439/159 |
| 5,971,780 A | * | 10/1999 | Youn | 439/160 |
| 6,028,267 A | * | 2/2000 | Byrne | 174/59 |
| 6,220,883 B1 | * | 4/2001 | Helot et al. | 439/341 |
| 2009/0039743 A1 | * | 2/2009 | Gevaert | 312/223.2 |

* cited by examiner

*Primary Examiner* — Hung S Bui
(74) *Attorney, Agent, or Firm* — Thomas, Kayden, Horstemeyer & Risley, LLP

(57) ABSTRACT

An embedded seat slot structure is disposed at a device having an opening. The embedded seat slot structure includes a cover, an interlocking portion, and a base. The cover covers the opening. The interlocking portion is pivotally connected with the device via a first pivot. An end of the interlocking portion close to the first pivot is connected with the cover. The base is pivotally connected with the device via a second pivot. An end of the base far away from the second pivot is close to the interlocking portion. The base has a connector facing the opening. When the cover is opened, the interlocking portion is driven to rotate, an end far away from the first pivot pushes the base, and then the base is rotated to make the connector exposed at the opening.

8 Claims, 9 Drawing Sheets

EMBEDDED SEAT SLOT STRUCTURE

CROSS-REFERENCES TO RELATED APPLICATIONS

This non-provisional application claims priority under 35 U.S.C. §119(a) on Patent Application No. 97151240 filed in Taiwan, R.O.C. on 2008 Dec. 29, the entire contents of which are hereby incorporated by reference.

BACKGROUND OF THE INVENTION

1. Field of the Invention

The invention relates to an embedded seat slot structure and, more particularly, to an embedded seat slot structure for connecting with a portable electronic device.

2. Description of the Related Art

As digital age comes, musical compositions are recorded and propagated via digital files instead of audio tapes, album CDs (compact disk), and album digital versatile discs (DVD). Furthermore, different kinds of digital players which can play digital audio and video data with a multimedia file format are developed.

After improvement for several generations, the digital player can not only provide good music quality, it also can store more and more songs. Thus, a common user can listen to music by carrying the digital player at anytime. To allow the user to go on to play and listen to music via the digital player when he is at home or drives, a peripheral device connected with the digital player is developed. As a result, the user may play music files stored in the digital player via a device such as a bedside audio or a car audio to enjoy fun of listening to songs.

However, when the user connects the digital player to the peripheral device, he needs to first open a dust cover of the peripheral device, adjust a connection seat to be at a fix position, and then connect the digital player. Not only the usage is inconvenient for the user, but also additional operation keys need to be disposed. Therefore, the appearance lacks aesthetic, and the desire to purchase of users may be decrease.

BRIEF SUMMARY OF THE INVENTION

The invention provides an embedded seat slot structure disposed at a device having an opening. The embedded seat slot structure includes a cover, an interlocking portion, and a base. The cover covers the opening. The interlocking portion is pivotally connected with the device via a first pivot. An end of the interlocking portion close to the first pivot is connected with the cover. The base is pivotally connected with the device via a second pivot. An end of the base far away from the second pivot is close to the interlocking portion. The base has a connector facing the opening. When the cover is opened, the interlocking portion is driven to rotate, an end far away from the first pivot pushes the base, and then the base is rotated to make the connector exposed at the opening.

A cover covers a connector in the device to make the cover and the surface of the device form a plane according to the invention. As a result, not only the overall appearance of the device is more beautiful, but also a dustproof function and a protection function for the connectors can be obtained. When the user uses the embedded seat slot structure, he just opens the cover, the interlocking portion pushes the base to make the connector exposed at the opening. Then the portable electronic device may be inserted in the connector, which is easy and convenient.

These and other features, aspects and advantages of the present invention will become better understood with regard to the following description, appended claims, and accompanying drawings.

DETAILED DESCRIPTION OF THE EMBODIMENTS

Figure 1:
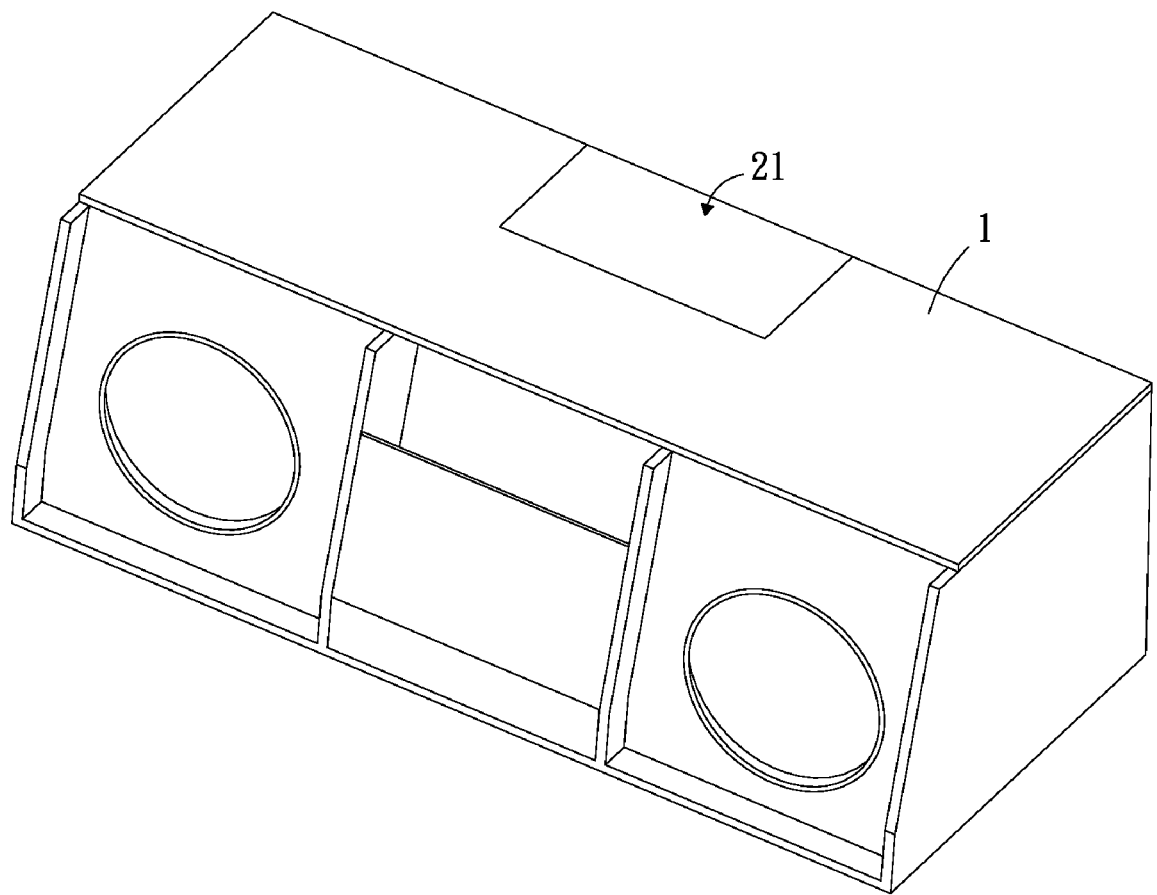
FIG. 1 is a schematic diagram showing an appearance of an embedded seat slot structure according to a first embodiment of the invention.
Figure 2:
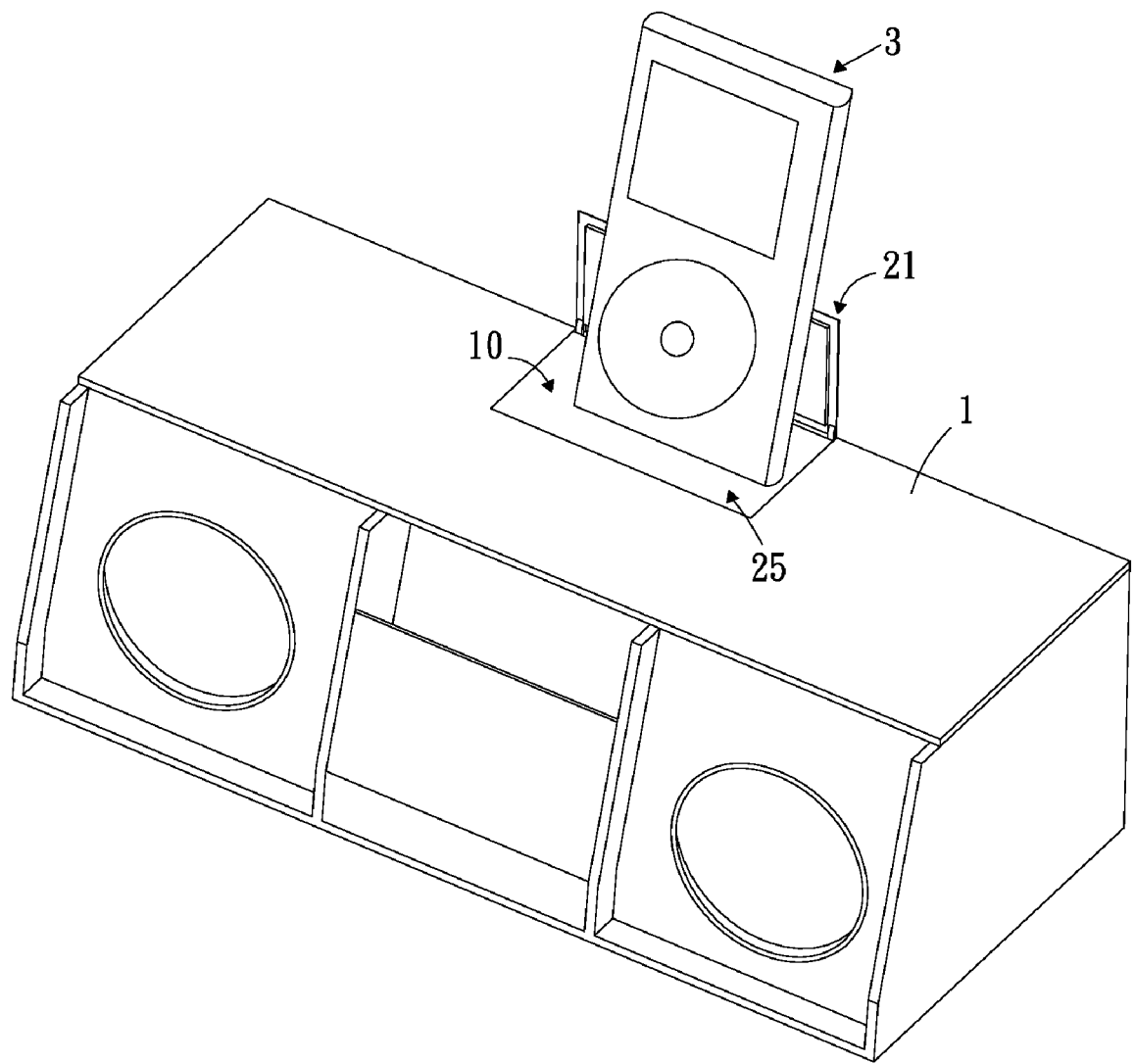
FIG. 2 is a schematic diagram showing an appearance of the embedded seat slot structure where a portable device is inserted according to a first embodiment of the invention.

FIG. 1 to FIG. 3C are schematic diagrams showing an embedded seat slot structure according to a first embodiment of the invention. The embedded seat slot structure according to the invention is disposed at a device 1 having an opening 10, and it is used for allowing a portable device 3 to be inserted therein. The device 1 is preferred to be, but not limited to a bedside stereo herein. The device 1 also may be an electronic device such as a portable stereo, a radio recorder, a personal computer (PC), a notebook. The portable device 3 is preferred to be, but it is not limited. The portable device 3 also may be an ipod, a walkman, a media player, a moving picture experts group audio layer-3 (MP3) player, or one of any other proper portable devices.

The embedded seat slot structure mainly includes a cover 21, an interlocking portion 23, a base 25, and a connector 27.

The cover 21 is appropriately rectangle-shaped. The cover 21 is disposed in the opening 10 of the device 1 to cover the rectangle-shaped opening 10. The cover 21 and a surface of the device 1 form a plane when the cover 21 covers the opening 10.

The interlocking portion 23 is disposed in the device 1. A first pivot 231 is disposed at an end of the interlocking portion 23 to be pivotally connected with the device 1. The end of the interlocking portion 23 close to the first pivot 231 is connected with the cover 21 and forms approximate L-shape with the cover 21. The interlocking portion 23 and the cover 21 may be one piece herein. The angle between the interlocking portion 23 and the cover 21 may be smaller than or equal to, but not limited to, ninety degrees. Furthermore, a push surface 233 is formed at an end of the interlocking portion 23 far away from the first pivot 231. The push surface 233 is approximately inclined and protrudes from the body of the interlocking portion 23 when it is viewed from a side. Additionally, the structure of the interlocking portion 23 illustrated above is just an example, but not used for limiting the invention. The interlocking portion 23 may be realized via a gear set according to a practical demand.

The base 25 is disposed in the device 1. A second pivot 251 is disposed at an end of the base to be pivotally connected with the device 1. The base 25 is used for allowing a relative component such as a print circuit board (PCB) to be disposed.

An inclined surface 253 corresponding to the push surface 233 is formed at an end of the base 25 far away from the second pivot 251. When the base 25 is not rotated to the opening, the inclined surface 253 is against the push surface 233 to make the push surface 233 of the interlocking portion 23 support the end of the base 25 far away from the second pivot 251, and the interlocking portion 23 may push the base 25 to make the base 25 rotate.

The connector 27 is on the base 25 and faces the opening 10 of the device 1. The connector 27 is kept in the device 1 or exposed at the opening 10 of the device 1 by rotating the cover 21 to different positions. The connector 27 is preferred to be a multi-pin connector such as a 30-pin connector connected with the digital player herein. The connector 27 may also be a universal serial bus (USB) connector, a multi-pin connector, a parallel pin connector, or one of any other proper connectors, and thus it may be connected with different portable devices 3.

Figure 3A:
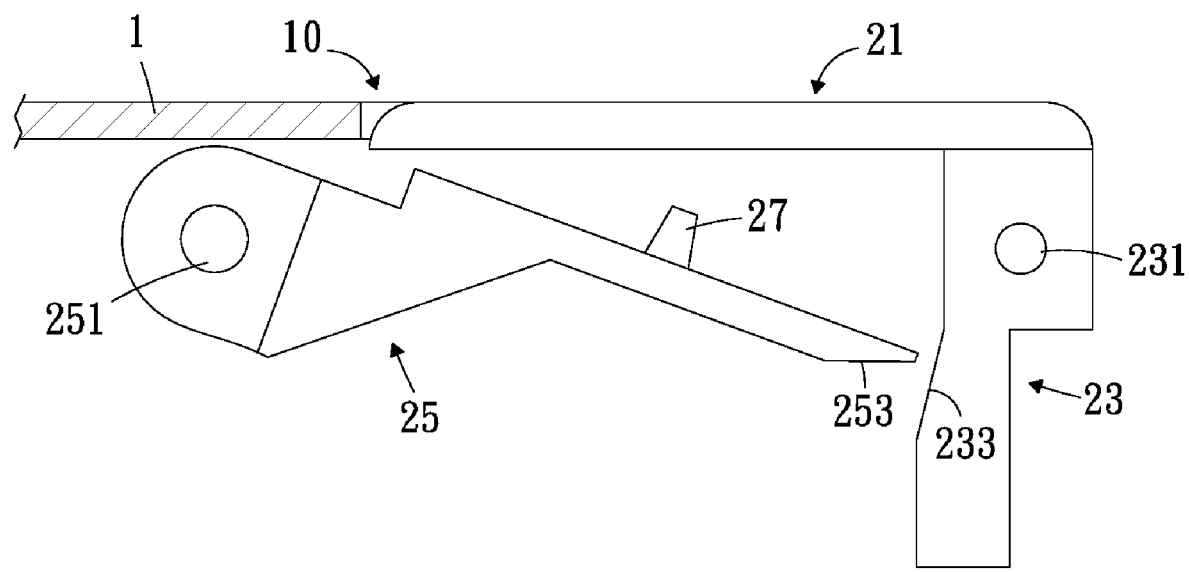
FIG. 3A~3C are schematic diagrams showing actions of the embedded seat slot structure according to a first embodiment of the invention.
Figure 3B:
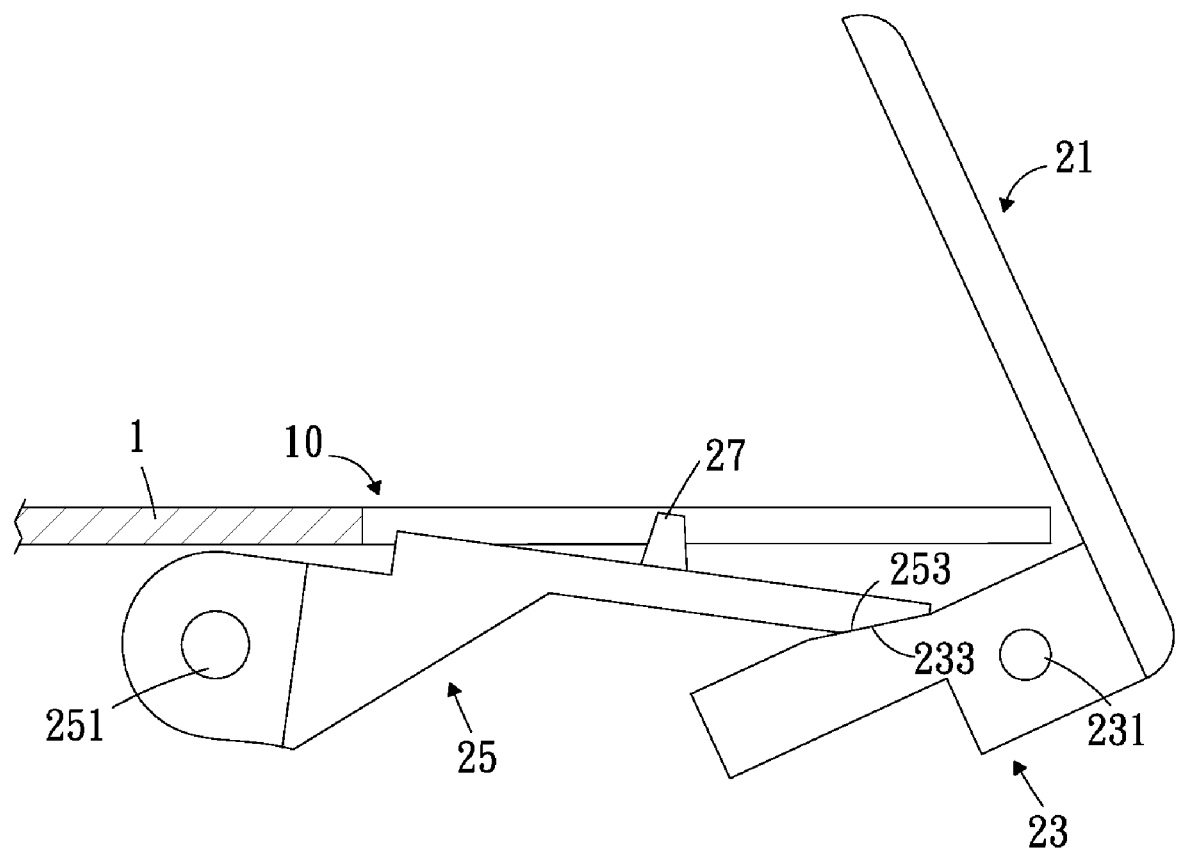
Figure 3C:
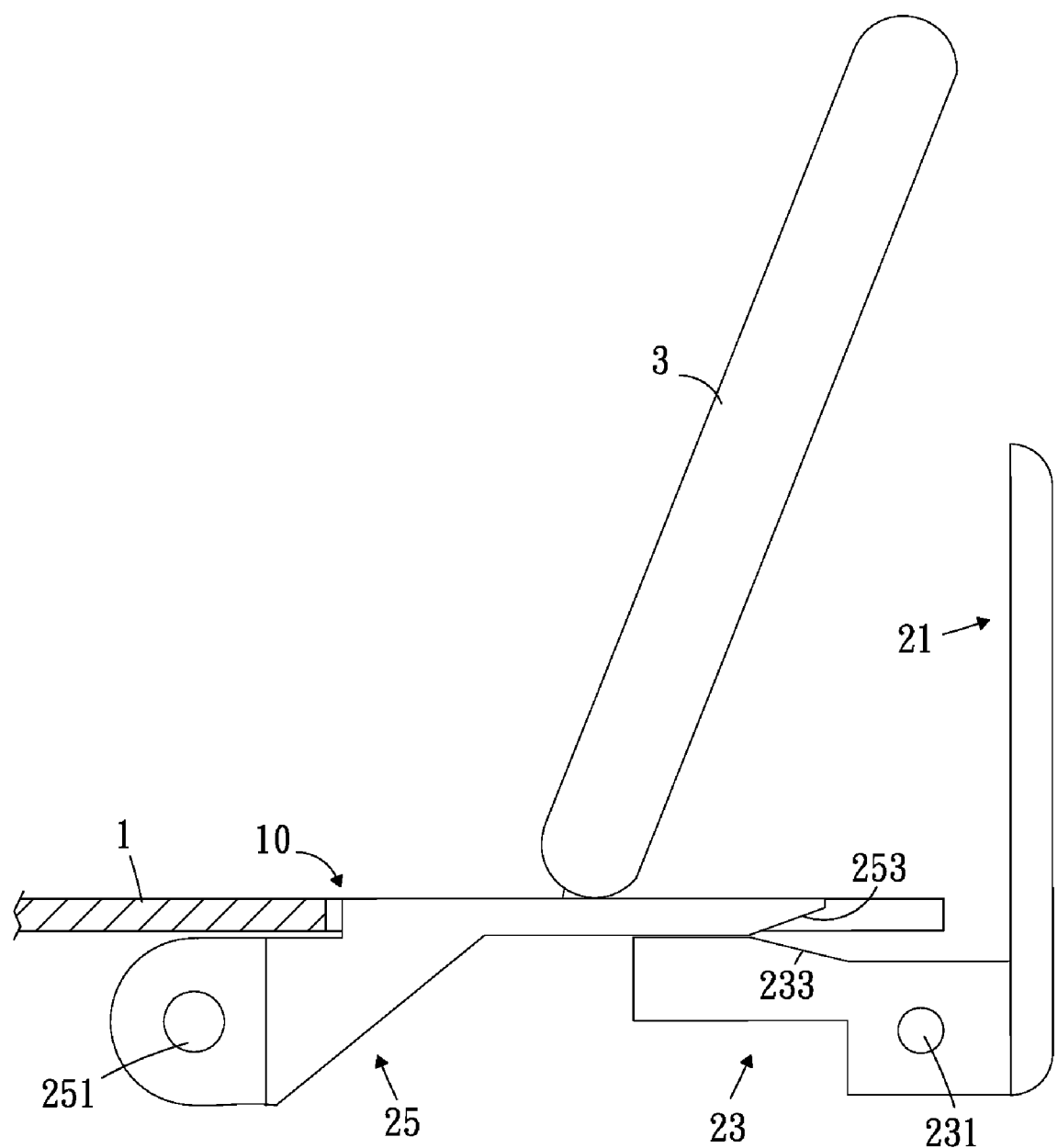

As shown in FIG. 3A to FIG. 3C, when the user uses the embedded seat slot structure, he just opens the cover 21 in the opening 10, the interlocking portion 23 is driven to rotate around the first pivot 231. Then the end of the interlocking portion 23 far away from the first pivot 231 pushes the base 25 to rotate around the second pivot 251. When the cover 21 is opened to be positioned, a part of the base 25 is in the opening 10, and the connector 27 is exposed at the opening 10. As a result, the portable device 3 may be inserted in the connector 27 to play audio-visual files of the portable device 3 or use data stored in the portable device 3. After the user takes the portable device 3 out, he just rotates the cover 21 to an original position in the opening 10 to cover the opening 10, the interlocking portion 23 is driven to back to an original position, and the base 25 is rotated via the gravity to make the inclined surface 253 back to an original position and supported by the interlocking portion 23.

Figure 4A:
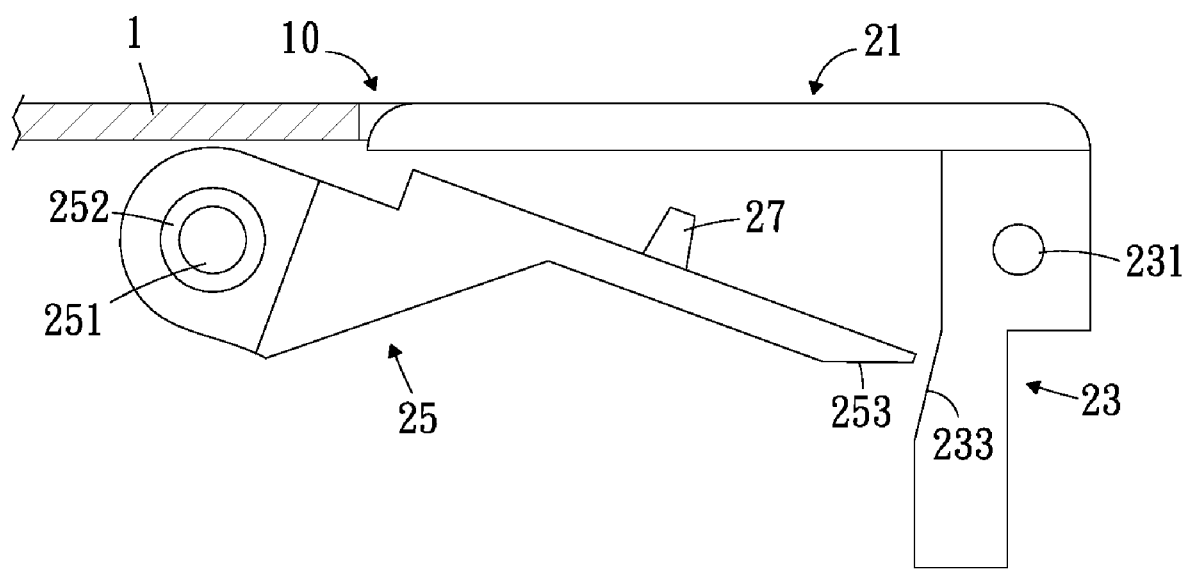
FIG. 4A and FIG. 4B are schematic diagrams showing actions of an embedded seat slot structure according to a second embodiment of the invention.
Figure 4B:
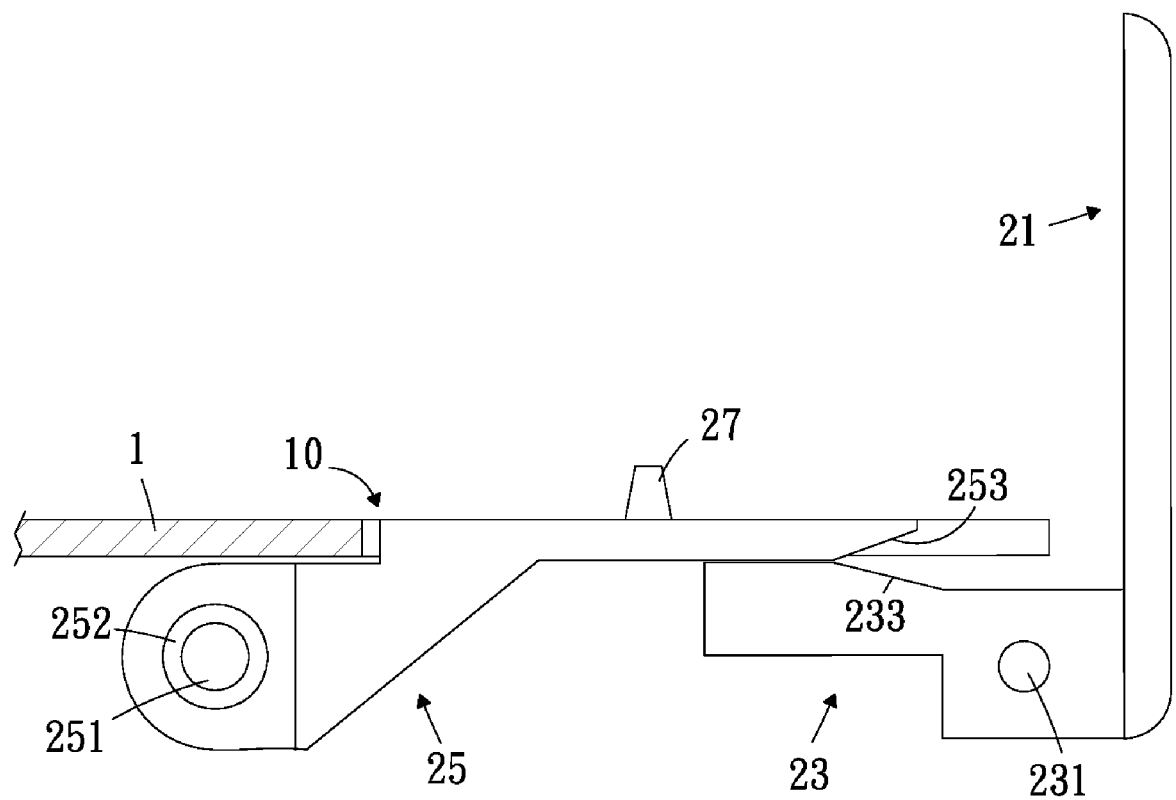

FIG. 4A and FIG. 4B are schematic diagrams showing actions of an embedded seat slot structure according to a second embodiment of the invention. In this embodiment, the second pivot 251 of the base 25 includes an elastic member 252. The elastic member 252 provides an elastic force smaller than the weight of the cover 21 to make an end of the base 25 against the cover 21. That is, the weight of the cover 21 produces a downward force to make the base 25 kept in the device 1. The elastic member 252 is preferred to be, but not limited to, a torsion spring. The elastic member 252 also may be one of any other rotary components. Moreover, the second pivot 251 may provide the elastic force, and then the elastic member 252 does not need to be disposed.

When the cover 21 in the opening 10 is opened, the cover 21 does not provide the downward force to press the base 25, and thus the base 25 is rotated via the elastic force provided by the elastic member 252 until a part of the base is against an inner surface of the device 1 to make a part of the base 25 in the opening 10 and the connector 27 exposed at the opening 10. Then, the portable device 3 may be inserted in the connector 27, and the base 25 can bear the downward force for inserting the portable device 3 via the elastic force provided by the elastic member 252. Additionally, to make the base 25 rotate more smoothly in a rotating process, a damping member (not shown) may be sleeved at the second pivot 251 of the base 25 to moderate the rotation of the base 25.

Additionally, when the user uses the embedded seat slot structure, he just opens the cover 21 in the opening 10, and the interlocking portion 23 is driven to rotate around the first pivot 231. If the rotating speed of the base 25 is slow, the interlocking portion 23 pushes the base 25 to rotate around the second pivot 251 to make the action of opening the cover 21 and the action of rotating the connector 27 out of the opening 10 more synchronous.

Figure 5A:
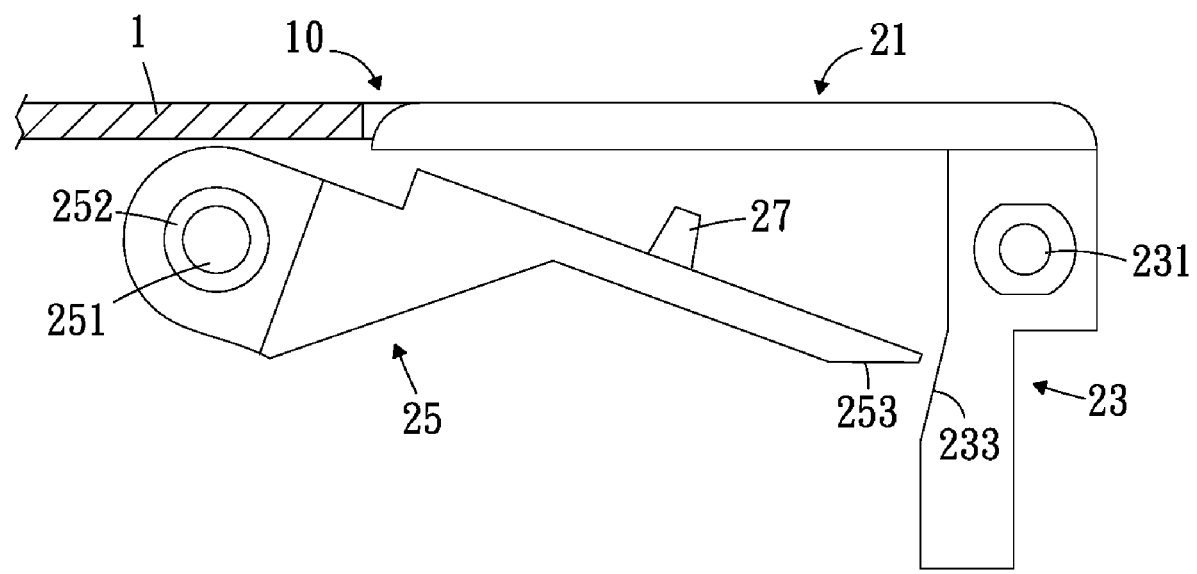
FIG. 5A and FIG. 5B are schematic diagrams showing actions of an embedded seat slot structure according to a third embodiment of the invention.
Figure 5B:
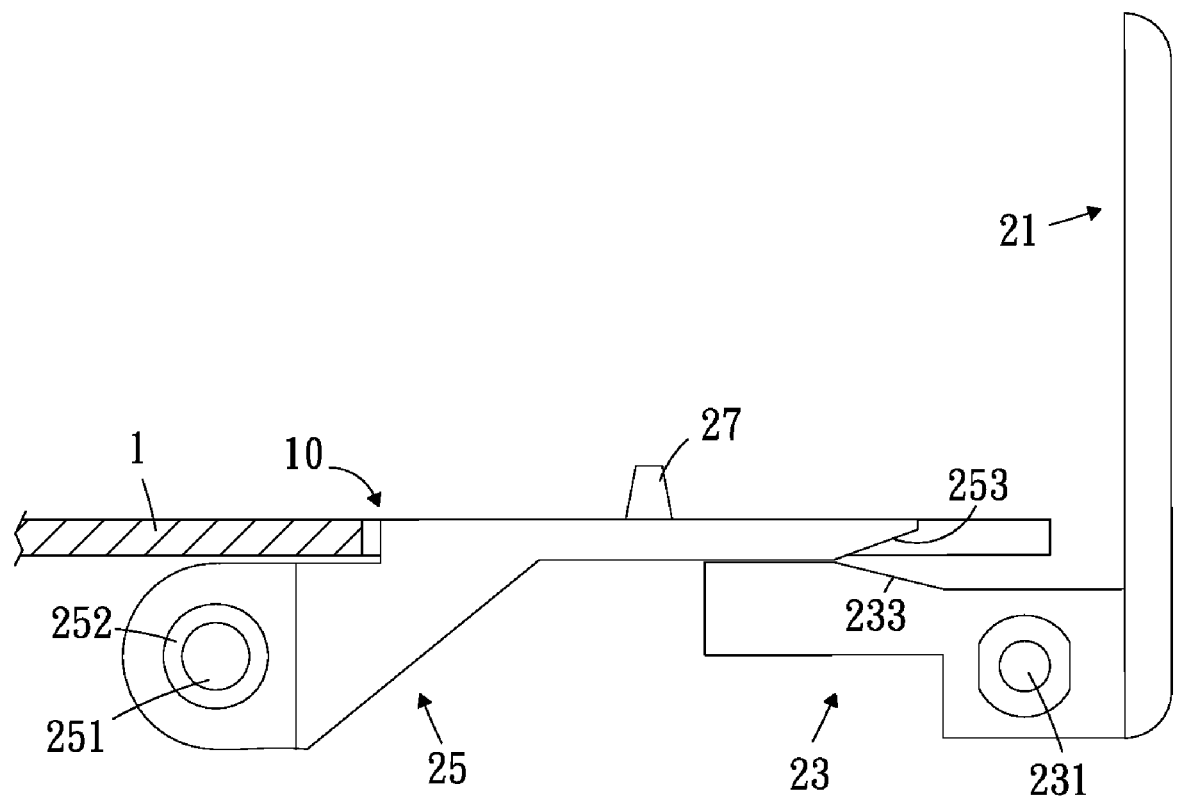

FIG. 5A and FIG. 5B are schematic diagrams showing actions of an embedded seat slot structure according to a third embodiment of the invention. The biggest difference between this embodiment and the second embodiment is illustrated hereafter. That is, when the user uses embedded seat slot structure and opens the cover 21 in the opening 10, if the angle between the cover 21 and the opening 10 is larger than a first predetermined angle, the first pivot 231 drives the cover 21 to directly rotate to an open position. For example, when the cover 21 is opened to make the angle between the cover 21 and the opening 10 larger than thirty degree, the first pivot 231 drives the cover 21 to directly rotate to the open position where the angle between the cover 21 and the opening 10 is one hundred and ten degrees. Furthermore, when the portable device 3 is inserted in the connector 27, the elastic member 252 and the first pivot 231 provide force to make the base 25 bear the downward force for inserting the portable device 3.

When the user takes the portable device 3 out and wants to rotate the cover 21 to an original position, if the angle between the cover 21 and the opening 10 is smaller than a second predetermined angle, the first pivot 231 drives the cover 21 to directly rotate to a closed position. For example, when the cover 21 is rotated to make the angle between the cover 21 and the opening 10 smaller than thirty degrees, the first pivot 231 drives the cover 21 to directly rotate to the closed position in the opening 10. As a result, the user opens or closes the cover 21 more easily and conveniently.

The first pivot 231 and the second pivot 251 may be other proper rotary plastic elements or metal elements.

A cover covers a connector in the device according to the invention, and it both has a dustproof function and a protection function to the connectors. Furthermore, the cover and the surface of the device forms a plane, and no keys or protrusions are on the surface of the embedded seat slot structure to make the overall appearance of the device more neat and beautiful. Moreover, the interlocking portion pushes the base to make the connector exposed at the opening according to the invention, and then the portable electronic device may be inserted in the connector, which is easy and convenient.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. An embedded seat slot structure disposed at a device having an opening, the embedded seat slot structure comprising:
   a cover covering the opening;
   an interlocking portion pivotally connected with the device via a first pivot, wherein an end of the interlocking portion close to the first pivot is connected with the cover; and
   a base pivotally connected with the device via a second pivot, wherein an end of the base far away from the second pivot is close to the interlocking portion, and the base has a connector facing the opening;
   wherein when the cover is opened, the interlocking portion is driven to rotate, an end far away from the first pivot pushes the base, and then the base is rotated to make the connector exposed at the opening.

2. The embedded seat slot structure according to claim 1, wherein the second pivot comprises an elastic member.

3. The embedded seat slot structure according to claim 2, wherein the elastic member provides an elastic force to make an end of the base against the cover.

4. The embedded seat slot structure according to claim 2, wherein the elastic member is a torsion spring.

5. The embedded seat slot structure according to claim 1, wherein the second pivot comprises a damping member.

6. The embedded seat slot structure according to claim 1, wherein the interlocking portion comprises a push surface, the base comprises an inclined surface corresponding to the push surface, and the push surface is against the inclined surface to make the interlocking portion push the base to rotate.

7. The embedded seat slot structure according to claim 6, wherein the cover is rotated to be back to an original position to cover the opening and drives the interlocking portion to rotate, and the base rotates via gravity to make the inclined surface back to an original position.

8. The embedded seat slot structure according to claim 1, wherein the connector is a universal serial bus (USB) connector, a multi-pin connector, or a parallel pin connector.

* * * * *